United States Patent [19]

Kircher et al.

[11] 4,075,756
[45] Feb. 28, 1978

[54] PROCESS FOR FABRICATING ABOVE AND BELOW GROUND PLANE WIRING ON ONE SIDE OF A SUPPORTING SUBSTRATE AND THE RESULTING CIRCUIT CONFIGURATION

[75] Inventors: Charles John Kircher, Yorktown Heights; Hans Helmut Zappe, Granite Springs, both of N.Y.

[73] Assignee: International Business Machines Corporation, Armonk, N.Y.

[21] Appl. No.: 701,059

[22] Filed: Jun. 30, 1976

[51] Int. Cl.² .............................. H05K 3/00
[52] U.S. Cl. ........................... 29/625; 427/63; 29/577 C; 307/245
[58] Field of Search ............. 29/625, 626, 577, 599; 427/96, 99, 62, 63, 88, 89, 93, 95; 428/195; 204/30, 32 R, 32 S, 35 R; 357/2, 4, 5; 174/68.5, DIG. 6; 317/101 A, 101 B, 101 C; 307/245, 306; 333/99 S

[56] References Cited

U.S. PATENT DOCUMENTS

| | | | |
|---|---|---|---|
| 3,351,774 | 11/1967 | Porter | 307/245 X |
| 3,366,519 | 1/1968 | Pritchard et al. | 427/63 X |
| 3,385,773 | 5/1968 | Frantzen | 29/628 X |
| 3,519,481 | 7/1970 | Joynson et al. | 427/63 |
| 3,588,777 | 6/1971 | Schroen | 338/32 |
| 3,728,176 | 4/1973 | Osborne et al. | 427/99 X |
| 3,849,276 | 11/1974 | Greiner | 204/192 |
| 3,852,795 | 12/1974 | Ames | 357/5 |
| 3,988,823 | 11/1976 | Hu | 29/577 |
| 3,988,824 | 11/1976 | Bodway | 29/577 |

*Primary Examiner*—Milton S. Mehr
*Attorney, Agent, or Firm*—Thomas J. Kilgannon, Jr.

[57] ABSTRACT

A fabrication method for integrated circuits is disclosed wherein a structure is formed on one side of a supporting substrate which provides a ground plane with "X" wiring on one side and "Y" wiring on the other side thereof. The method includes a number of alternative initial planarization steps which permits the resulting device to be substantially planar, thereby allowing it to be used as a substrate for preparation of high density integrated circuits. A first planarization step includes the deposition of a niobium thin film on a doped silicon substrate; the delineation of the desired niobium "X" wiring pattern using well-known photolithographic and etching techniques, leaving the photoresist in place to protect the niobium; the anodization of exposed silicon substrate portions to form silicon dioxide surrounding the niobium to a higher level than the niobium; and the removal of the photoresist.

24 Claims, 8 Drawing Figures

PROCESS FOR FABRICATING ABOVE AND
BELOW GROUND PLANE WIRING ON ONE SIDE
OF A SUPPORTING SUBSTRATE AND THE
RESULTING CIRCUIT CONFIGURATION

BACKGROUND OF THE INVENTION

1. Field of the Invention

This invention relates generally to a method for fabricating integrated circuits and, more particularly, relates to methods for fabricating integrated circuits which require that the wiring to be utilized be on both sides of a ground plane while, at the same time, maintaining a substantial degree of planarity amongst the various levels of metallization. Still more specifically, it relates to a fabrication method wherein the various levels of metallization are formed on one side of a supporting substrate. Still more specifically, it relates to a method of fabrication wherein via holes are formed during the fabrication process which are self-aligned.

The invention also relates to circuit arrangements which, because "X" and "Y" wiring are disposed on opposite sides of a ground plane, higher circuit densities are achieved. This results from the fact that device and wiring regions can be disposed on opposite sides of a ground plane in overlapping though insulated relationship with one another.

DESCRIPTION OF THE PRIOR ART

Single wire over ground plane transmission lines are well known in the microwave transmission line art. Single wire transmission lines with double ground planes are also well known in the same art. These structures are, however, normally built up in such a way that the ground plane resides on a supporting structure or one of the ground planes is itself the supporting structure.

In the integrated circuit environment, the semiconductor substrate generally carries transistor devices or the like; diffusions which may represent one level of interconnections; and a layer of metallization disposed in insulated relationship with the semiconductor substrate interconnecting various devices by penetrating an insulating layer. Other integrated circuit approaches require a number of wiring levels which, if possible, are maintained substantially planar with respect to each other and the surface of the supporting substrate. IBM Technical Disclosure Bulletin, Vol. 13, No. 2, July 1970, p. 429, in an article entitled "Multi-level Wiring for Integrated Circuits" discloses a process which provides planarization for multi-level wiring. In this publication, metallization is delineated on a quartz layer and glass is built up around it to form metallization regions surrounded by insulation. Insulation is then formed with selective via holes and a metallization layer is then subsequently deposited on the layer and in the via hole. This article merely shows a method for interconnecting between various metallization layers and does not show a structure wherein a ground plane is interposed between two layers of metallization and wherein the upper metallization penetrates the ground plane in insulated relationship and simultaneously contacts the lower metallization. In the present arrangement, while "X" and "Y" wiring must be connected by way of via interconnection metallurgy, the intermediate ground plane must be insulated from both these wiring levels to provide an operative device. No technique for accomplishing this is shown in this reference.

U.S. Pat. No. 3,666,519, Ser. No. 339,018 in the name of Pritchard et al shows a typical process for manufacturing multi-layer film circuits which are utilized in the cryogenic environment. In this patent, the ground plane lies directly on the surface of a substrate and the remaining multi-layers are formed over it using photolithographic and etching techniques.

U.S. Pat. No. 3,588,777, Ser. No. 744,826, filed July 15, 1968 in the name of Schroen shows an arrangement wherein tunneling devices and associated control lines are formed directly over an insulating substrate. This patent utilizes the tailoring of photoresist material to form waveguides that interconnect the tunnel barriers into groups.

More recently, U.S. Pat. No. 3,852,795, Ser. No. 320,784, filed Jan. 3, 1973, and assigned to the same assignee as the present application, shows a typical Josephson junction structure disposed over a ground plane, but with both "X" and "Y" wiring on the same side of the ground plane. Thus, none of the above cited references address the problem of forming "X" and "Y" wiring on both sides of the ground plane while at the same time providing for self-aligned via holes which can be utilized as an interconnection between the wiring levels through the ground plane. To the extent that the teaching of the present application makes such a structure possible, the resulting structure is also novel providing enhanced circuit density, impedance control of both the "X" and "Y" wiring and avoiding impedance mismatches at cross-overs. At this point, it should be appreciated that the use of anodizable materials for the "X" wiring particularly, in combination with the conductive substrate, makes the present fabrication approach possible. It should also be appreciated that while the substrate acts as a normal conductor during fabrication at room temperature, it becomes insulating at 4.2 degrees K. due to carrier freeze-out, eliminating any possibility for the substrate to act as a conductive member during actual operation in the cryogenic environment.

SUMMARY OF THE INVENTION

In accordance with the broadest aspect of the present invention, a process for fabricating above and below ground plane wiring on one side of a supporting substrate is provided which includes the step of forming a plurality of anodizable metallic conductors surrounded by insulation on the surface of a substrate which is conductive at room temperature. It also includes the step of forming a conductive ground plane of anodizable metallic material on the insulation in insulated spaced relationship with the conductors. Finally, a layer of insulation is placed on the ground planes and a plurality of metallic conductors is formed on the insulation.

In accordance with the broader aspects of the present invention, a process for fabricating above and below ground plane wiring is provided which includes the step of fabricating at least a single actuable device on said ground plane insulation.

In accordance with the broader aspects of the present invention, a process is provided wherein the step of forming a conductive ground plane includes the step of forming at least a single via hole in said conductive ground plane in registry with at least a single one of the metallic conductors.

In accordance with more specific aspects of the present invention, a process is provided wherein the step of forming a plurality of metallic conductors on the ground plane insulation includes the step of depositing a film of metallic material on the ground plane insulation and in any via hole present, and then delineating the plurality of metallic conductors to interconnect at least one of the plurality of conductors to at least one of the anodizable metallic conductors.

In accordance with still more specific aspects of the present invention, a process is provided wherein the step of forming at least a single via hole in the ground plane includes the step of masking at least a portion of at least a single one of the metallic conductors and anodizing the plurality of metallic conductors and the portion of the at least single one of the metallic conductors different from the originally mentioned portion to form insulation thereon. It also includes the step of depositing a film of anodizable metal on the originally formed insulation and the last mentioned insulation.

In accordance with still more specific aspects of the present invention, a method is provided wherein the anodizable metallic conductors are made from a superconducting material, specifically, niobium. The substrate involved is doped silicon and, where anodized, the oxide is silicon dioxide. When anodized, the metallic superconductor niobium provides an insulator made of niobium oxide.

In accordance with the broadest aspect of the present invention, a circuit arrangement is provided which includes a substrate; a first plurality of conductive lines disposed thereon; a ground plane disposed over the conductive lines, and at least a single actuable device overlying at least a portion of the first plurality of conductive lines. Finally, a second plurality of conductive lines disposed in overlying relationship with a portion of the first plurality of conductive lines different from said at least a portion of said first plurality of conductive lines.

In accordance with the broader aspects of the present invention, a circuit arrangement is provided which further includes means for connecting at least one of said first plurality of conductive lines with at least one of said second plurality of conductive lines.

In accordance with the broader aspects of the present invention, a circuit is provided wherein the actuable device is a device capable of carrying Josephson current and the first and second plurality of conductors and said ground plane are made from superconducting materials.

It is, therefore, an object of this invention to provide a process which permits the fabrication of a structure having a ground plane with "X" wiring on one side thereof and "Y" wiring on the other side thereof on one surface of a supporting substrate.

Another object is to provide a process wherein both the "X" wiring and the "Y" wiring have controllable values of impedance.

Still another object is to provide a process whereby interconnections can be made through the ground plane between the "X" and "Y" wiring.

Still another object is to provide a process which results in a structure which is substantially planar.

Still another object is to provide a circuit arrangement which permits higher circuit densities to be obtained than prior art arrangements.

Still another object is to provide a circuit arrangement wherein cross-over impedance mismatches are avoided.

The foregoing and other objects, features and advantages of the invention will become apparent from the following more particular description of the preferred method and embodiment of the invention as illustrated in the accompanying drawings.

DESCRIPTION OF A PREFERRED EMBODIMENT

Figure 1A:
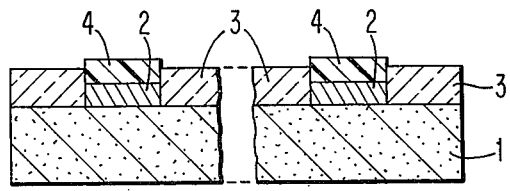
FIG. 1A is a cross-sectional drawing of a doped silicon substrate showing a plurality of anodizable conductors surrounded by insulation. The figure shows the first of a number of approaches which may be utilized to obtain a planar surface on which a ground plane may ultimately be deposited.

Referring now to FIG. 1A, there is shown therein a cross-sectional drawing of a semiconductor substrate 1 which has been doped with a p-conductivity type dopant to a level to render it conductive to facilitate subsequent anodization of metal lines deposited on one surface thereof. In a preferred arrangement, silicon is used as the material for substrate 1. Using a p-type dopant such as boron, substrate 1 is doped to a level of approximately $10^{16} - 10^{18}$ atoms/cm$^3$. This doping level renders the substrate conductive at room temperature but, for applications with circuitry which operates at 4.2° K., the substrate becomes insulating due to carrier freeze-out. The p-type dopant is introduced into substrate 1 during crystal growth or by any means such as diffusion, well known to those in semiconductor fabrication art. A plurality of anodizable metal conductors 2 is shown disposed on the upper surface of substrate 1. Conductors 2 may be made from any anodizable metal which is suitable for use in the fabrication of integrated circuits. For application in a cryogenic environment, conductors 2 may be any suitable conductor which is superconducting at 4.2° K. One such metal is niobium. Other materials such as aluminum may be utilized for ordinary applications while materials such as vanadium and various alloys, for example, $Hf_{0.5}Nb_{0.5}$, $Mo_{0.5}Re_{0.4}$, $Mo_{0.6}Ru_{0.4}$, $Re_{0.7}W_{0.3}$, $Nb_3Al$, are suitable conductors for the cryogenic environment.

Conductors 2 are formed by first depositing a film of metal such as niobium on the surface of substrate 1. Using well-known photolithographic and etching techniques, a commercially available positive resist such as AZ1350 is formed on the surface of the metal, exposed and developed so that photoresist masks in the form of strips remain on the surface of the niobium film. Using an etchant such as an aqueous mixture of Hf and $HNO_3$, the exposed niobium is removed down to the surface of substrate 1. Alternatively, the niobium may be removed by the well-known techniques of sputter etching or reactive ion-etching. Leaving the photoresist in place, substrate 1 is inserted into an anodization bath where insulating regions 3 are formed on the exposed surface of the silicon substrate 1. The anodization bath is composed for example of 4 gms $KNO_3$ in 900 ml ethylene glycol + 100 ml $H_2O$, with the anode being formed of conductive silicon substrate 1 and a cathode of platinum, for example. The anodization is carried out to a point where the resulting silicon oxide extends above the level of conductors 2. Since conductors are themselves to be anodized in a following step to provide a planar surface with the upper surface of insulating regions 3 and to provide a proper spacing for impedance purposes between conductors 2 and a ground plane which is to be deposited, the height of the anodization should be carefully controlled. After the anodization step which forms insulating regions 3, photoresist masks 4 are removed. This completes the steps required to form conductors 2 which may otherwise be characterized as "X" wiring and sets up the structure preparatory to planarization and the formation of the ground plane and "Y" wiring.

Figure 1B:
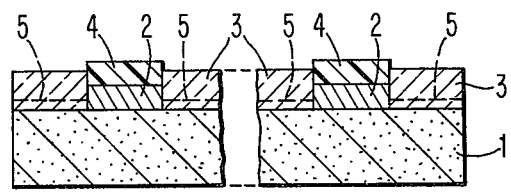
FIG. 1B shows a cross-sectional drawing similar to that shown in FIG. 1A which represents another approach which may be utilized to obtain a planar surface on which a ground plane may ultimately be deposited.

FIG. 1B is a cross-sectional view of substrate 1 having a plurality of conductors 2 thereon which are surrounded by insulation regions 3. Substrate 1 is prepared in the same manner as described in connection with FIG. 1A. A thin conductive film of niobium or other suitable material is also deposited in the same manner described in connection with FIG. 1A. After forming photoresist regions 4 in the same manner described in connection with FIG. 1A, the niobium metallization is chemically or sputter etched in a slightly different fashion. The etching is carried out using the same technique but is stopped prior to exposing the surface of substrate 1, leaving a thin layer of metal between conductors 2. In a subsequent step and with photoresist regions 4 in place, the thin layers of niobium or other suitable metal are anodized in a bath consisting for example of a mixture of 9 gms of ammonium pentoborate in 100 ml of ethylene glycol. The anodization is carried out using stainless steel or platinum as a cathode and the niobium layer on the surface of substrate 1 as the anode. The anodization step which forms an oxide of the metal or, in this instance, niobium oxide ($Nb_2O_5$) forms insulating regions 3. The anodization step is carried out using conditions sufficient to convert the thin niobium regions indicated by dashed line 5 in FIG. 1B, completely to niobium oxide and to form the same oxide to a level higher than the level of conductive lines 2. This is done for the same reasons cited in connection with FIG. 1A. Photoresist masks 4 are then stripped and a structure similar to that shown in FIG. 1 is obtained; the only difference being that insulating regions 3 are silicon dioxide in FIG. 1A and niobium oxide in FIG. 1B.

Figure 1C:
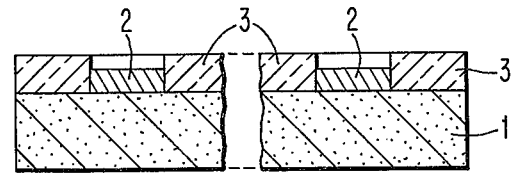
FIG. 1C is a cross-sectional drawing of a substrate similar to that shown in the previous figures which shows still another approach which may be utilized to form a planar surface on which a ground plane may ultimately be deposited.

FIG. 1C shows a cross-sectional view of a doped silicon substrate 1 having a plurality of conductors 2 disposed on a surface thereof which are spaced apart by insulating regions 3 of silicon oxide or other suitable material. This structure is fabricated by initially forming a layer of silicon oxide on the surface of substrate 1. The silicon oxide layer may be formed by any well-known technique including evaporation, sputtering, chemical vapor deposition and thermal growth. These techniques are well known to those skilled in the semiconductor fabrication art. Again, using well-known photolithographic and etching techniques, the silicon oxide layer is patterned to expose strips of the doped silicon substrate 1. Using substrate 1 as an electrode, niobium or other suitable metal is electroplated to a thickness which is less than the height of the silicon oxide regions 3. The plating is carried out using, for example, a fused salt plating bath consisting of a mixture of KF, NaF, LiF, and $K_2NbF_7$, wherein substrate 1 is the cathode and the anode is any suitable metal. Thus, the structure of FIG. 1C is similar to the structures of FIGS. 1A, 1B and, like the structures in the latter figures, is now ready for subsequent planarization, ground plane formation and "Y" wiring steps.

Figure 1D:
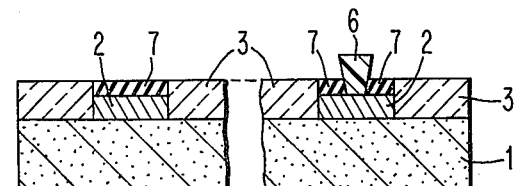
FIG. 1D is a cross-sectional drawing of a doped silicon substrate which shows the formation of an insulator on the surface of one of the conductors and the partial masking of another of the conductors as a prelude to the formation of a via hole.

Referring now to FIG. 1D, substrate 1 is shown in an intermediate condition in the process of the present application after the partial masking of one of conductors 2 preparatory to forming a via hole, and the planarization of conductors 2. Using the structure and materials of FIG. 1B as a preferred embodiment, that structure is immersed in an anodization bath to form an oxide on any unmasked portions of conductors 2. For example, while the left-most conductor 2 is unmasked, the right-most conductor 2 in FIG. 1D is partially masked by a photoresist mask 6. Mask 6 is formed in the usual manner by depositing photoresist on the insulating regions 3 and conductors 2. After the well-known exposure and development steps, mask 6 results which covers a portion of right-most conductor 2 in FIG. 1D. The generation of mask 6 can be carried out by conventional stencil lift-off similar to that shown in U.S. Pat. No. 3,849,136, Ser. No. 384,349, filed July 31, 1973, and assigned to the same assignee as the present invention or by any other technique well known to those skilled in the semiconductor art. In the next step, insulating regions 7 are formed on the exposed surfaces of conductors 2 by the same anodization technique which was utilized to form insulating regions 3 in FIG. 1B. Thus, the exposed surfaces of conductors 2 have formed thereon niobium oxide or other suitable oxide which is formed at a voltage sufficient to raise the oxide to the same height as insulating regions 3. In this way, a planar surface is formed and conductors 2 are surrounded top and sides by niobium oxide. At this point, it should be appreciated that the anodization step which formed insulating regions 7 is made possible by the presence of conductive silicon substrate 1 which, with niobium conductors 2, acts as an anode during the anodization step. In FIG. 1D, it should be noted that a via hole is present in rightmost insulating region 7 as a result of the presence of photoresist mask 6.

Figure 1E:
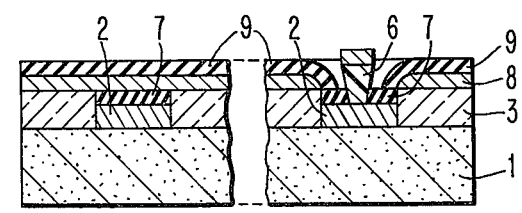
FIG. 1E is a cross-sectional drawing of the arrangement of FIG. 1D showing the additional steps of forming and anodizing a ground plane.

Referring now to FIG. 1E, a cross-sectional drawing of an intermediate structure is shown which results from the deposition of a layer of metal to form a ground plane and the anodization of such ground plane. Starting with the structure of FIG. 1D which now has a planar surface except for the presence of photoresist mask 6, a layer of niobium 8 or other suitable conductor is deposited by evaporation, for example, on the planer surface everywhere except on those portions of insulating regions 7 which are shadowed by photoresist mask 6. The shadowing results from the undercutting of photoresist mask 6 during development. Then, in a subsequent step, niobium layer 8 is anodized in the same manner as conductors 2 and described hereinabove in connection with FIG. 1D. The anodization step forms insulating layer 9 on niobium layer 8. It should be noted that, as a result of the anodization step, the edge of niobium layer 8 adjacent photoresist mask 6 becomes anodized and a portion of insulating layer 9 overlaps insulating regions 7, forming an electrically insulating barrier between niobium layer 8 and any metallization subsequently deposited in a via hole which is provided when photoresist mask 6 is removed.

Figure 1F:
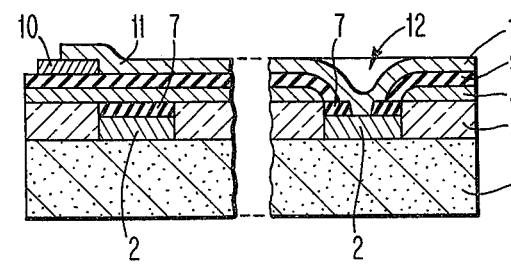
FIG. 1F is a cross-sectional drawing of the arrangement of FIG. 1E showing the additional step of forming a final level of wiring on the anodized insulation formed on the ground plane. In addition, the figure shows the interconnection between the last mentioned wiring and one of the originally deposited conductors by means of a via hole and, finally, a generalized device which may be a Josephson junction, for example, to which a connection is made.

Referring now to FIG. 1F, a final structure is shown which includes above and below ground plane wiring on one side of a substrate. The structure also includes a device which may be a Josephson junction or other actuable device formed on niobium oxide layer 9. Apart from the fabrication of an actuable device 10 which can be fabricated in a known way, a layer of metallization which is subsequently delineated into a plurality of conductors 11 is deposited on niobium oxide layer 9 and on the exposed surfaces of niobium conductors 2 at the bottom of via hole 12 which appeared upon the removal of photoresist mask 6. The deposition of niobium is carried out in the same manner as the deposition of niobium layer 8, and conductors 11 are delineated by the usual, well-known photolithographic and etching or stencil lift-off techniques. Thus, FIG. 1F shows a plurality of conductors 2 which may otherwise be characterized as "X" wiring; a conductor 11 representative of a plurality of similar conductors which may otherwise be characterized as "Y" wiring disposed orthogonally to conductors 2; and a niobium layer 8 which may otherwise be characterized as a ground plane for conductors 2 and 11.

In FIG. 1F, a layer of silicon oxide may be disposed atop niobium oxide regions 3, 7 and layer 9. The SiO layer atop region 3,7 may be deposited after the formation of niobium oxide regions 7 in FIG. 1D. The SiO layer atop niobium oxide layer 9 may be similarly deposited after the formation of layer 9 in FIG. 1E. This is done to reduce the thickness of the niobium oxide which would be required to provide a desired impedance for the "X" and "Y" lines. By introducing the layers of lower dielectric constant, the composite dielectric constant is less than that of niobium oxide alone. The composite dielectric reduces the density of pin holes and the consequently resulting short circuits.

While conductors 11 have been shown disposed in orthogonal relationship with conductors 2, it should be appreciated that conductors 11 may bear any angular relationship with conductors 2 without departing from the spirit of the present invention. It should also be appreciated that, while only two conductors 2 and only one of conductors 11 have been shown in FIG. 1F, this has been done for convenience in exposition and not by way of limitation. With respect to device 10, it should be understood that this could also be a semiconductor device without departing from the spirit of the present invention. Where the device is a Josephson junction, it may be fabricated using a technique for forming such devices as shown in U.S. Pat. No. 3,849,276, Ser. No. 125,993, filed Mar. 19, 1971 and assigned to the same assignee as the present invention.

Figure 2A:
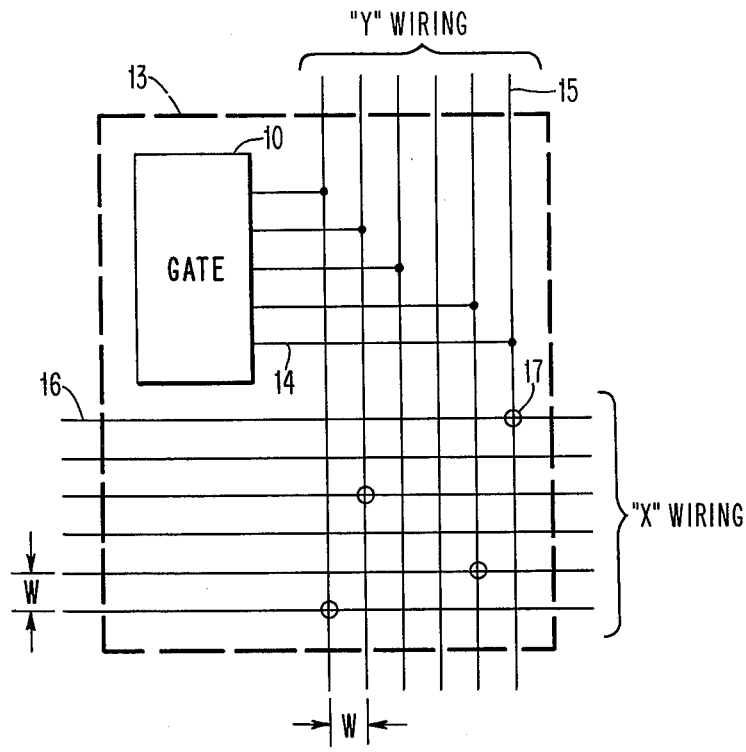
FIG. 2A shows a schematic of a prior art arrangement wherein two levels of wiring on the same side of a ground plane are utilized to make connections between a gate or other circuit configuration and signal and power lines using, in some instances, via holes. The drawing is not intended to be representative of any particular circuit but is intended to be representative of a circuit layout which takes up a given area.

Typical dimensions for a representative structure are as follows:

line widths of "X" and "Y" wiring, 2, 11, respectively — 0.5 - 25 $\mu$m
thicknesses of layers 2, 8 and 11 — 0.2 –1 $\mu$m
thicknesses of layers 3, 7 and 9 — 0.01 - 0.2 $\mu$m
characteristic impedances — 0.1 - 100 $\Omega$ Referring now to FIG. 2A, there is shown therein a schematic drawing of a prior art layout of a gate or other circuit configuration which has leads connected to "Y" wiring which, in turn, in some instances, is connected by means of via holes to "X" wiring. With a given spacing of W between adjacent "X" and "Y" wires or interconnections, a certain amount of substrate area is required as defined by dashed line 13 in FIG. 2A. Gate or circuit configuration 10 in this prior art arrangement requires a discrete area into which it is not possible for either the "X" or "Y" wiring to be positioned since device 10 is either disposed directly on an underlying substrate or on an insulated ground plane which is disposed on the surface of a substrate (not shown). Thus, a signal or power line 14 may extend from gate or circuit configuration 10 to interconnect with a "Y" wiring line 15 which, in turn, is connected to a "X" wiring line 16 by way of a via hole indicated at 17 in FIG. 2A and otherwise shown therein as a circle. The arrangement of FIG. 2A in addition to the requirements for substrate surface area, is subject to a number of difficulties including impedance mismatches for "X" and "Y" wiring at crossovers with a consequent impact on the speed of circuit operation and unwanted signal coupling between lines and crossovers.

Figure 2B:
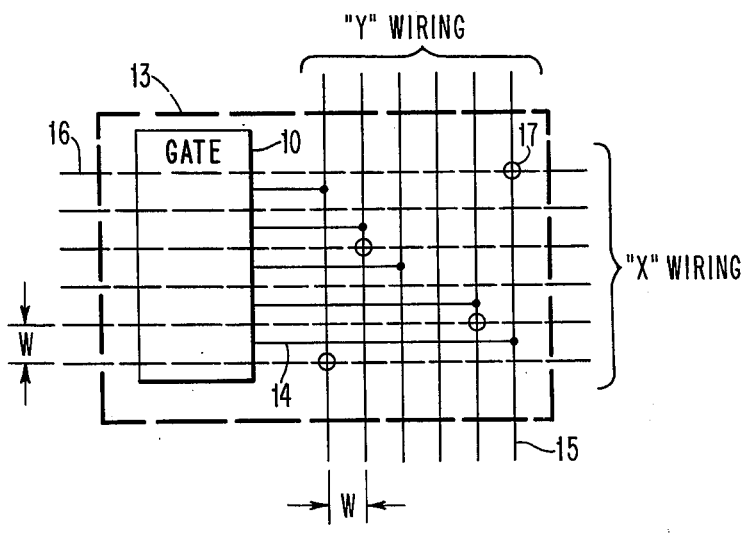
FIG. 2B is a schematic of a circuit layout obtainable by practicing the process of the present invention using a gate or circuit configuration of the same size as shown in FIG. 2A and above and below ground plane wiring of the same spacing as shown in FIG. 2A. Connections are made between wiring levels by means of vias. A comparison of FIGS. 2A and 2B clearly indicates that the latter arrangement provides for higher circuit densities.

These disadvantages are not present in the arrangement of FIG. 2B wherein a gate or circuit configuration 10 of the same size as that shown in FIG. 2A is positioned in insulated relationship with a ground plane. Similarly, "Y" wiring (otherwise identified as 11 in FIG. 2A) is disposed over a ground plane while "X" wiring (otherwise identified as 2 in FIG. 2A) is disposed beneath a ground plane and all of these elements are disposed on the surface of a substrate in a manner similar to that shown in FIG. 1F. Using the same criteria such as gate size and width W between adjacent wiring elements 2, 11, it can be seen that the surface area requirements, as indicated by dashed box 13 in FIG. 2B, are much less than the area requirements of the arrangement of FIG. 2A. The use of the ground plane permits gate or circuit configuration 10 to be disposed in overlying relationship with the "X" wiring while being electrically and physically separated from such wiring. Using the same reference characters in FIG. 2B as used in FIG. 2A, connections from gate 10, such as power or signal line 14, can be connected to "Y" wiring line 15 and connected to an "X" wiring line 16 by means of a via hole 17 which is further indicated in FIG. 2B by a circle. The arrangement shown clearly provides for circuit densities up to twice as great relative to that provided by the arrangement shown in FIG. 2A when arrays of circuit arrangements encompassed by dashed box 13 in FIG. 2B are utilized. It should also be clear that discontinuities due to crossovers of "X" and "Y" wiring are eliminated and that the impedance for both the "X" and "Y" wiring can be the same, thereby eliminating the usual impedance matching problems ordinarily encountered in circuits similar to that shown in FIG. 2A.

Returning to a consideration of FIG. 1F, it should be appreciated that the thicknesses of the various regions and layers have been exaggerated for the sake of clarity. In the same figure, it is obvious that the device is not planar in the region of via hole 12. This should, however, not detract from the device as being substantially planar for, in the regions where device 10 is positioned, the structure is planar. This is the most important region in which discontinuities, crossover and mismatches should be avoided. To the extent that a planar surface is required "Y" wiring 11 can be plated-up to form a totally planar surface.

What has been provided is a process for fabricating integrated circuits which provides a structure and circuit arrangement which is particularly adapted for the operation of high speed circuits like Josephson junction devices. While emphasis has been placed on circuits which are superconducting in character, it should be appreciated that the above described process and circuit arrangement can easily be adapted to the semiconductor environment and provide the same advantages therein.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for fabricating above and below ground plane wiring on one side of a supporting substrate comprising the steps of:
    forming a plurality of anodizable metallic conductors surrounded by insulation on the surface of a substrate which is conductive at room temperature,
    forming a conductive ground plane of anodizable metallic material on said insulation in insulated spaced relationship with said anodizable metallic conductors,
    forming at least a single via hole in said ground plane in registry with at least a single one of said anodizable metallic conductors,
    forming insulation on said ground plane, and,
    forming a plurality of metallic conductors on said ground plane insulation.

2. A process according to claim 1 further including the step of fabricating at least a single actuable device on said ground plane insulation.

3. A process according to claim 1 wherein the step of forming a plurality of anodizable metallic conductors surrounded by insulation includes the steps of:
    depositing a film of anodizable metal of given height on a surface of said substrate,
    delineating said plurality of anodizable metallic conductors leaving exposed strips of substrate between conductors,
    anodizing said substrate to form an oxide of the substrate material of a height greater than said given height between said anodizable metallic conductors, and
    anodizing said anodizable metallic conductors to form an oxide thereon to a height sufficient to bring said last mentioned oxide to the same height as the oxide of said substrate material.

4. A process according to claim 1 wherein the step of forming a plurality of anodizable metallic conductors surrounded by insulation includes the steps of:
    depositing a film of anodizable metal of given height on a surface of said substrate,
    delineating a plurality of thin portions in said film between pairs of thick portions of said film the latter being covered with masking material,
    anodizing said thin portions to convert them to an oxide of said metal of a height greater than said given height providing a plurality of isolated anodizable metallic conductors on said substrate, and,
    anodizing said anodizable metallic conductors to form an oxide thereon to a height sufficient to bring said last mentioned oxide to the same height as said oxide of said metal.

5. A process according to claim 1 wherein the step of forming a plurality of anodizable metallic conductors surrounded by insulation includes the steps of:
    forming a layer of insulating material of given height on the surface of said substrate,
    delineating in said material a plurality of openings leaving exposed strips of substrate in said openings,
    electroplating an anodizable metal in said openings to provide a plurality of anodizable metallic conductors of height less than said given height, and,
    anodizing said anodizable metallic conductors to form an oxide thereon of thickness sufficient to bring said oxide to the same height as said given height.

6. A process according to claim 1 wherein the step of forming a ground plane in insulated spaced relationship with said anodizable conductors includes the steps of:
    anodizing said plurality of anodizable metallic conductors to form an insulating layer thereon, and,
    depositing a film of anodizable material on said insulation and on said insulating layer.

7. A process according to claim 1 wherein the step of forming insulation on said ground plane includes the step of anodizing said ground plane to form a layer of the oxide of said material on said ground plane.

8. A process according to claim 1 wherein the step of forming a plurality of metallic conductors includes the steps of:
    depositing a film of metal on said ground plane insulation, and,
    delineating a plurality of conductors on said ground plane insulation.

9. A process according to claim 1 wherein said anodizable metallic conductors are made from superconductors.

10. A process according to claim 1 wherein said anodizable metallic conductors are made from niobium.

11. A process according to claim 1 wherein said insulation is one of:
    an oxide of the substrate material and an oxide of the metal of said anodizable metallic conductors and;
    an oxide of the metal of said anodizable metallic conductors.

12. A process according to claim 1 wherein said substrate is doped silicon.

13. A process according to claim 1 wherein said conductive ground plane is made from a superconducting material.

14. A process according to claim 1 wherein said conductive ground plane is made from niobium.

15. A process according to claim 1 wherein said metallic conductors on said ground plane insulation are made from a superconductor.

16. A process according to claim 1 wherein said metallic conductors on said ground plane insulation are made from niobium.

17. A process according to claim 2 wherein said actuable device is a device capable of carrying Josephson current.

18. A process according to claim 1 wherein the step of forming a plurality of metallic conductors on said ground plane insulation includes the step of depositing a film of metallic material on said ground plane insulation and in said at least a single via hole and delineating said plurality of metallic conductors to interconnect at least one of said plurality of conductors to at least one of said anodizable metallic conductors.

19. A process according to claim 1 wherein the step of forming at least a single via hole in said ground plane includes the steps of:
 masking at least a portion of said at least a single one of said anodizable metallic conductors, and,
 anodizing said plurality of anodizable metallic conductors and the portion of said at least a single one of said anodizable metallic conductors different from said portion to form insulation thereon, and,
 depositing a film of anodizable metal on said insulation and said last mentioned insulation.

20. A process according to claim 3 further including the step of depositing a layer of insulation on said ground plane insulation, on said oxide of said substrate material and on said oxide of said anodizable metallic conductors having a dielectric constant less than that of the oxide of said anodizable metallic conductors.

21. A process according to claim 4 further including the step of depositing a layer of insulating material on the oxide of said metal and on said an oxide said material having a dielectric constant less than that of said oxide of said metal.

22. A process according to claim 4 further including the step of depositing a layer of insulation on said ground plane insulation and on said oxide of said metal and on said an oxide said insulation having a dielectric constant less than that of said oxide of said metal.

23. A process according to claim 18 further including the step of fabricating at least a single actuable device on said ground plane insulation.

24. A process according to claim 19 wherein said actuable device is a device capable of carrying Josephson current.

* * * * *